United States Patent [19]

Blessington et al.

[11] Patent Number: 5,478,699

[45] Date of Patent: Dec. 26, 1995

[54] METHOD FOR PREPARING A SCREEN PRINTING STENCIL

[75] Inventors: Daniel R. Blessington, deceased, late of Rochester, by Elizabeth L. Blessington, legal representative; Gary T. Marks, Phelps; Jerry E. Sergent, Palmyra; Judy A. Sline, Romulus; Stephen A. De Lucia, Webster, all of N.Y.

[73] Assignee: AMTX, Inc., Canandaigua, N.Y.

[21] Appl. No.: 849,862

[22] Filed: Mar. 12, 1992

[51] Int. Cl.⁶ .................. G03F 7/12; B05D 5/12
[52] U.S. Cl. ............ 430/308; 101/127; 101/128.21; 101/128.4; 101/129; 205/67; 205/69; 205/70; 205/76; 205/78; 205/127; 427/96; 427/98; 430/324; 430/935
[58] Field of Search ..................... 430/308, 324, 430/935; 101/128.21, 128.4, 129, 127; 427/96, 98; 205/67, 76, 78, 69, 70, 127

[56] References Cited

U.S. PATENT DOCUMENTS

| | | |
|---|---|---|
| 2,459,129 | 1/1949 | Gresham et al. |
| 3,476,658 | 11/1969 | Corwin. |
| 3,610,143 | 10/1971 | Greenwood et al. |
| 3,668,081 | 6/1972 | Borner. |
| 4,033,831 | 7/1977 | Bakewell .................. 101/128.4 |
| 4,118,288 | 10/1978 | Ruckl. |
| 4,379,737 | 4/1983 | Mearig. |
| 4,401,520 | 8/1983 | Steppan et al. .............. 204/11 |
| 4,519,983 | 4/1990 | Lake et al. |
| 4,789,425 | 12/1988 | Drake et al. ................. 156/644 |

OTHER PUBLICATIONS

Metal Mask Specifications, Version 01, Process Lab Micron Co., Ltd., 1991.

*Primary Examiner*—James J. Seidleck
*Assistant Examiner*—John M. Cooney, Jr.
*Attorney, Agent, or Firm*—Oliff & Berridge

[57] ABSTRACT

To prepare a screen printing stencil, a pattern of resist, having a complementary design to the final screen printing stencil, is applied to a conductive mandrel. A patterned layer is electroformed onto the exposed surface of the mandrel such that the layer corresponds to the exposed orifices of the pattern of resist. The resulting screen printing stencil can have an overgrowth geometry or a straight-wall geometry depending on the type of photoresist employed, and can be used in the electronic substrate fabrication and electronic assembly industries.

28 Claims, 1 Drawing Sheet

METHOD FOR PREPARING A SCREEN PRINTING STENCIL

BACKGROUND

The present invention relates to a method for preparing a screen printing stencil. More specifically, this invention relates to a method for preparing a screen printing stencil by electroforming.

Screen printing stencils have a wide variety of uses in the electronic substrate fabrication and electronic assembly industries. These include, but are not limited to, the printing of conductors, resistors, dielectrics, solder masks, and solder pastes. Screen printing stencils currently are fabricated by "chemical milling" also known as chemical etching.

U.S. Pat. No. 3,610,143 to Greenwood discloses a rotary screen printing stencil produced by etching techniques. A mandrel is provided with a layer of etchable material on an outer surface thereof. A copper layer then is electroformed onto the mandrel, followed by applying a nickel layer and another copper layer. A resist then is coated on the mandrel followed by UV exposure and etching.

U.S. Pat. No. 4,915,983 to Lake et al. discloses a multilayer circuit board fabrication process which utilizes separately designed and fabricated composite structures consisting of a patterned conductive metal foil supported by a photo-processible insulating film. The patterns on the metal foil are formed in a conventional manner, such as by applying a photoresist layer to an epoxy fiber glass substrate coated with a copper foil and patterning the photoresist layer by exposing it to ultraviolet light through a stencil-like film mask. Areas exposed on the photoresist are polymerized. The unpolymerized areas are removed by a chemical solution, leaving areas of copper, in the desired conductor pattern, underneath the protective barrier of the remaining polymerized photoresist. The exposed copper then is etched away and the remaining photoresist is chemically removed to expose the resulting conductor pattern.

As the size of electronic assemblies becomes smaller, chemical etching is incapable of holding the required tolerances and generating sufficiently small features. Thus, there is a need for a method of preparing screen printing stencils which are capable of holding required tolerances and generating sufficiently small features.

SUMMARY OF THE INVENTION

The present invention is directed to a method for preparing a screen printing stencil by applying a pattern of resist, which is complementary to a screen printing stencil, onto a conductive mandrel; electroforming a patterned layer onto the mandrel such that the layer includes exposed orifices corresponding to the pattern of resist; and removing the layer from the mandrel to provide the screen printing stencil.

This method provides a screen printing stencil with smaller features and features which are closer together than can be formed using a chemical etching method. This enables fabrication and assembly of, for example, "fine pitch", i.e., small feature spacing, surface-mount printed wiring boards. This method also provides an easier means of obtaining different thicknesses in different sections of a screen printing stencil than is possible using a chemical etching method and permits different amounts of solder to be printed, where required, on the same board.

DETAILED DESCRIPTION OF PREFERRED EMBODIMENTS

Figure 1:
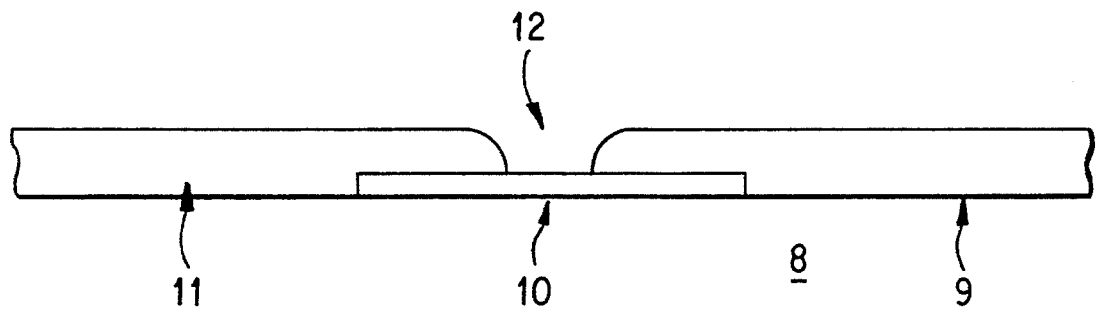
FIG. 1 illustrates a cross-sectional view of a screen printing stencil on a mandrel, prepared according to a method of the present invention using a liquid, thin film resist.

A pattern of resist, which is complementary to a screen printing stencil, is applied to a conductive mandrel. The pattern of resist can be prepared according to any suitable method, such as photoprinting, (contact/noncontact). The pattern of resist can be prepared prior to applying it to a conductive mandrel or it can be prepared directly on the mandrel. When the pattern of resist is prepared, it is prepared with an appropriate phototool design which is complementary to the pattern requirements corresponding to desired features of a screen printing stencil. Such phototool designs can vary widely in specific designs and are commonly used in the art.

Typical mandrel materials include stainless steel, iron plated with chromium or nickel, nickel, titanium, aluminum plated with chromium or nickel, titanium palladium alloys, nickel-copper alloys such as Inconel® 600 and Invar® (available from Inco), and the like. Non-metallic substrates can also be used if they have been appropriately metallized using metallization techniques known to the art, such as, electroless, metallization, vapor deposition etc. The mandrel can be of any suitable shape. If cylindrical, the surface of the mandrel should be substantially parallel to the axis of the mandrel.

Typical resist materials include thin film liquid, thick film liquid and dry film resists. These resist materials can be classified as positive or negative as is well known in the art, and are either aqueous processable or solvent processable in commonly employed organic solvents such as benzene, dichloromethane, trichloroethane and the like.

A patterned layer is electroformed on the mandrel bearing a pattern of resist. The electroforming process takes place within an electroforming zone comprised of an anode; a cathode; and an electroforming bath. The bath may be composed of ions or salts of ions of the patterned layer forming material, the concentration of which can range from trace to saturation, which ions can be in the form of anions or cations; a solvent; a buffering agent, the concentration of which can range from 0 to saturation; an anode corrosion agent, the concentration of which can range from 0 to saturation; and, optionally, grain refiners, levelers, catalysts, surfactants and other additives known in the art. The preferred concentration ranges may readily be established by those of skill in the art without undue experimentation.

A preferred electroforming bath to plate nickel on a mandrel comprises about 80 mg/ml of nickel ion in solution, about 20–40 mg/ml of $H_3BO_3$, about 3.0 mg/ml of $NiCl_2 \cdot 6H_2O$ and about 0.004–0.006 ml/liter of sodium lauryl sulfate. Other suitable electroforming bath compositions include, but are not limited to, Watts Nickel: about 68–88 mg/ml of nickel ion, about 50–70 mg/ml of $NiCl_2 \cdot 6H_2O$ and about 20–40 mg/ml of $H_3BO_3$; chloride sulfate: about 70–100 mg/ml of nickel ion, about 145–170 mg/ml of $NiCl_2 \cdot 6H_2O$ and about 30–45 mg/ml $H_3BO_3$; Concentrated sulfamate: about 100–120 mg/ml of nickel ion, about 3–10 mg/ml of $NiCl_2 \cdot 6H_2O$, about 30–45 mg/ml of $H_3BO_3$. Electroless nickel baths can also be employed. Various types are available depending upon the properties needed in the electroform deposition. These electroless nickel baths are well known to those skilled in the art.

Examples of metals which can be electroformed onto the surface of a mandrel include, but are not limited to, nickel, copper, gold, silver, palladium, tin, lead, chromium, zinc, cobalt, iron, and alloys thereof. Preferred metals are nickel and copper. Any suitable conductor or material that can be electrochemically deposited can be used, such as conductive polymers, plastics and electroless nickel deposits. Examples of suitable conductive electroless nickel deposits include, but are not limited to, nickel-phosphorus, nickel-boron, poly-alloys, such as copper-nickel phosphorus, nickel-polytetrafluoroethylene, composite coatings and the like. Methods of preparing electroless nickel deposits employed within the scope of this invention are well known to those skilled in the art.

The electrolytic bath is energized using a suitable electrical source. Patterned layer forming ions from the solution are electroformed on the exposed conductive surfaces of the mandrel determined by the pattern of resist. The process is continued until a patterned layer has deposited on the exposed surface of the mandrel to a desired thickness, preferably ranging in thickness from at least about 0.004 mm–0.2 mm. Preferably, the thickness of the electroformed patterned layer ranges from about 0.10 mm to about 0.20 mm.

After the desired thickness is electroformed on the surface of the mandrel, the mandrel is removed from the solution. The formed stencil can be removed from the surface of the mandrel by standard methods which include, but are not limited to, mechanical separation, thermal shock, mandrel dissolution and the like. These methods are well known to those of skill in the art.

The resulting screen printing stencil can have at least two types of geometry. FIG. 1 illustrates an overgrowth geometry. In screen printing stencils having an overgrowth geometry, electroplated material 11 overlaps the portions of the screen which contain the resist spot 10 forming a depressed orifice 12. This type of geometry typically occurs when the resist material 10 on mandrel 8 is a thin film liquid resist. Resist materials which can be employed to form this type of geometry in a screen printing stencil 9 include, but are not limited to, those liquid resists typically containing 2-ethoxyethyl acetate, n-butyl acetate, xylene, o-chlorotoluene, toluene and photoactive compounds and blends of photoactive compounds. Photoactive compounds are capable of responding to light photoelectrically or capable of responding to light by chemical reaction. Examples of photoactive compounds include, but are not limited to, diazo based compounds or diazido based compounds.

Figure 2:
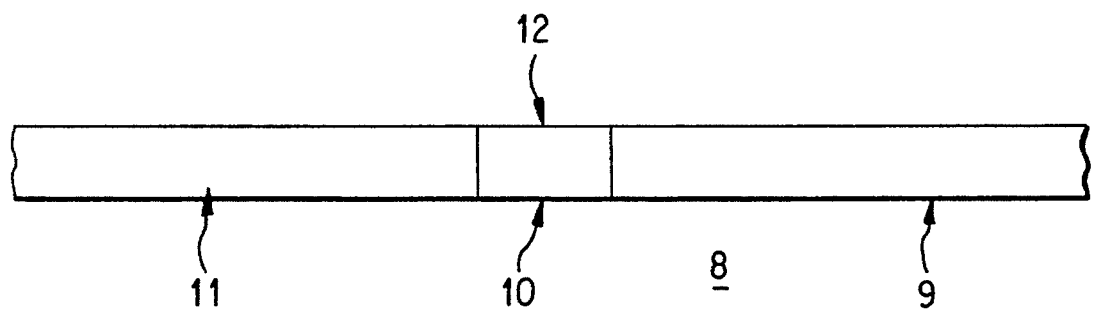
FIG. 2 illustrates a cross-sectional view of a screen printing stencil on a mandrel, prepared according to a method of the present invention made with a dry film or thick film resist.

If the resist material employed is a dry film resist or a thick film liquid resist, a straight-wall geometry is formed on the screen printing stencil as illustrated in FIG. 2. In straight-wall geometry, the electroformed layer 11 is continuous with the resist material 10 in orifice 12. Dry film resist materials suitable for preparing a straight wall geometry include, but are not limited to, those solvent processable resists typically containing: benzophenone, methyl salicylate, di-t-butyl cresol, methacrylate, tetramethylsuccinonitrile, methylene chloride, polyol acrylate monomers; or aqueous processable resists typically containing: benzophenone, methyl-4-(trichloromethyl)-2 5-cyclohexadienone-1, ethyl-4-dimethylamino benzoate, tetramethylsuccinonitrile, methanol, polyol acrylate monomer. Thick film liquid resist materials suitable for preparing a straight wall geometry include, but are not limited to, those resists typically containing: 2-ethoxyethyl acetate, n-butyl acetate, xylene, O-chlorotoluene, toluene, blends of novalak resins, and photoactive compounds. Novalak resins are obtainable from E.I. du Pont de Nemours and Co. in Wilmington, Del., U.S.A.

Advantageously, the screen printing stencil prepared according to the method of the present invention can have very small to very large features, for example, a feature can have a minimum width as small as about 0.004 mm to about 0.2 mm. A preferred width of a feature ranges from about 0.1 mm to about 0.2 mm. The distance between the features may also vary widely, for example, a distance between features can be as small as about 0.004 mm to about 0.2 mm. A preferred distance between features ranges from about 0.1 mm to about 0.2 mm. The dimensions and spacing of the photoresist on the screen printing stencil and the electroforming time determine the dimensions of the features on the stencil, and thus variations from these exemplary ranges may readily be made by those of skill in the art. The thickness of the stencil can be as small as about 0.004 mm to about 0.2 mm. A preferred thickness ranges from about 0.10 mm to about 0.20 mm.

Different thicknesses in different sections of the stencil can be achieved more easily than with current methods of preparing stencils. The different thicknesses in different sections of the screen printing stencil can be formed by coating the first electroformed patterned layer formed on a mandrel with another layer of a pattern of resist which is complementary to a pattern requirement corresponding to a desired feature and thickness followed by electroplating. Thus, the final screen printing stencil can have multiple electroformed layers. Thus, for example, different thicknesses of different sections of a screen printing stencil can be formed by depositing layers of a pattern of resist on only a portion of a first electroformed layer followed by further electroplating, resulting in further growth of the thickness of the electroform only on uncovered portions of the first electroformed layer.

Photoresist material can be removed from the stencil and/or mandrel by any suitable method practiced in the art. Such methods include washing the stencil in trichloroethane or dichloromethane (solvent based photoresists), or washing the stencil in sodium hydroxide or sodium carbonate (aqueous based photoresists). Other suitable methods of removing photoresist from a stencil and/or mandrel are known in the art and are typically provided by suppliers of photoresist material.

Screen printing stencils prepared according to the present invention can be employed for a number of purposes including, but not limited to, printing of materials for the electronic substrate fabrication and electronic assembly industries. Such uses include, but are not limited to, the printing of conductors, resistors, dielectrics, solder masks and solder pastes.

The following example is intended to further illustrate the method of this invention but it is not intended to limit its scope.

EXAMPLE 1

A line drawing in the nature of a design for a stencil pattern is made on a piece of paper such that dark lines correspond to the final design desired to be imprinted. The lines are separated by non-image bearing areas. A positive or negative phototool of the original artwork is prepared using conventional photographic processes. The phototool for a negative resist has clear lines corresponding to the lines of the original artwork and darkened areas corresponding to the areas between the lines. As is known by those of skill in the art, a phototool used for positive resist would have these areas reversed, i.e., the lines would be dark and the areas between the lines would be clear.

A conductive mandrel made of nickel, copper, aluminum or stainless steel, etc. is coated with a dry film negative resist such as du Pont Riston® obtainable from E.I. du Pont de Nemours and Co. in Wilmington, Del., U.S.A. Du Pont Riston® is a mixture of benzophenone, methyl salicylate, di-t-butyl cresol, methacrylate, tetramethylsuccinonitrile, methylene chloride and polyol acrylate monomer. The conductive mandrel also could be coated with liquid positive resist such as those made by Shipley, Inc. (Newton, Mass.). These positive resist materials include solvent processable resists containing 2-ethoxyethyl acetate, n-butyl acetate, xylene, o-chlorotoluene, toluene, blends of novalak resins and photoactive compounds.

In the case of negative resist, the phototool which was prepared earlier is tightly secured to the surface of the resist coated mandrel. The mandrel is irradiated with UV light at a wavelength of about 300–400 nanometers for about 90–240 seconds. The phototool is removed leaving those portions of the resist which were exposed to the UV radiation polymerized and those portions of the resist that did not receive the UV radiation still in semi-solid form. The resist layer is developed on the mandrel with conventional developing equipment and chemistry. Those portions of the resist which did not receive the UV radiation are washed away in the development process, leaving only the polymerized portions remaining on the surface of the mandrel. In the case of positive resist systems, irradiated areas are washed away and non-irradiated areas remain after the development process.

The mandrel is removed from the developer solution and washed in distilled water to remove any residual developer solution. An anode and the cathode mandrel with the developed resist are placed in an electroforming bath which is a solution of about 80 mg/ml of nickel ion, about 30 mg/ml of $H_3BO_3$, about 3–10 mg/ml of $NiCl_2 \cdot 6H_2O$ and about 0.004–0.006 ml/liter of sodium lauryl sulfate. The electrodes are energized with a suitable source of D.C. current. The process is allowed to proceed for an appropriate time to provide a deposit of the required thickness. Portions of the mandrel covered with the resist remain unplated. The mandrel is removed from the bath, and washed in distilled water. The screen printing stencil is removed from the mandrel by mechanical separation and the resist remaining on the stencil is washed away with a solution of sodium carbonate. The design on the surface of the screen printing stencil can be employed to print a resistor circuit.

What is claimed is:

1. A method for fabricating an electrical substrate comprising:
   (a) applying a pattern of thick film resist, which is complementary to a pattern of a screen printing stencil for an electrical circuit, onto a conductive mandrel, wherein said pattern of thick film resist has a thickness of greater than 0.01 mm;
   (b) electroforming a patterned metal layer onto portions of the mandrel determined by the pattern of resist;
   (c) removing the layer from the mandrel to provide a screen printing stencil; and
   (d) placing said stencil adjacent an electrical substrate and printing said electrical circuit thereon.

2. The method of claim 1, wherein the thin film liquid resist is 2-ethoxyethyl acetate, n-butyl acetate, xylene, o-chlorotoluene or toluene.

3. The method of claim 1, wherein the pattern of resist comprises a dry film resist.

4. The method of claim 3, wherein the dry film resist is benzophenone,methyl-4-(trichloromethyl)-2,5-cyclohexadienone-1, ethyl-4-dimethylamino benzoate, tetramethylsuccinonitrile, methanol or polyacrylate monomer.

5. The method of claim 1, wherein the pattern of resist comprises a thick film liquid resist.

6. The method of claim 5, wherein the thick film liquid resist is 2-ethoxyethyl acetate, n-butyl acetate, xylene, o-chlorotoluene or toluene.

7. The method of claim 1, wherein the metal layer comprises at least one member selected from the group consisting of nickel, copper, gold, silver, palladium, tin, lead, cobalt, chromium, iron, zinc and an alloy thereof.

8. The method of claim 1, wherein the metal is nickel or copper.

9. The method of claim 1, wherein the layer is nickel-boron, copper-nickel phosphorus, nickel-polytetrafluoroethylene or a composite thereof.

10. The method of claim 2, wherein the layer consists essentially of nickel.

11. The method of claim 3, wherein the layer consists essentially of nickel.

12. The method of claim 5, wherein the layer consists essentially of nickel.

13. The method of claim 1, wherein steps (a) and (b) are repeated at least once to provide a multilayer screen printing stencil for an electrical circuit.

14. A screen printing stencil prepared according to the method of claim 1, wherein an orifice of the stencil is about 0.1 mm to about 0.2 mm wide.

15. A screen printing stencil prepared according to the method of claim 1, wherein a distance between orifices of the stencil is about 0.1 mm to about 0.2 mm.

16. The method of claim 1, wherein the metal layer is about 0.004 mm to about 0.2 mm thick.

17. A screen printing stencil prepared according to the method of claim 1, wherein an orifice of the stencil is about 0.1 mm to about 0.2 mm wide.

18. A screen printing stencil prepared according to the method of claim 1, wherein a distance between orifices of the stencil is about 0.1 mm to about 0.2 mm.

19. A method for fabricating a screen printing stencil for electronic substrate fabrication having different thicknesses in different portions of the stencil comprising:
   (a) applying a first pattern of resist, which is complementary to a pattern of the screen printing stencil for an electrical circuit, onto a conductive mandrel;
   (b) electroforming a first patterned metal layer onto the conductive mandrel as determined by the first pattern of resist to form an electroformed layer;
   (c) depositing a second pattern of resist on only a portion of the first electroformed patterned layer;
   (d) electroforming a second patterned metal layer onto the first patterned layer as determined by the second layer of a pattern of resist; resulting in further growth of the thickness of the electroformed layer only on portions of the first electroformed layer not coated with the second layer of a pattern of resist.

20. The method of claim 19, further comprising placing said stencil adjacent an electronic substrate material and printing thereon conductors, resistors or dielectrics.

21. The method of claim 19, further comprising placing said stencil adjacent an electronic substrate material and printing thereon solder masks or solder pastes.

22. A method for fabricating an electrical substrate, comprising:
   (a) applying a pattern of thick film resist complementary to a pattern of a screen printing stencil for a conductor, resistor, dielectric, solder mask or solder paste onto a conductive mandrel, wherein said pattern of thick film resist has a thickness of greater than 0.01 mm;

(b) electroforming a patterned metal layer onto portions of the mandrel determined by the pattern of resist;

(c) removing the layer from the mandrel to provide a screen printing stencil; and (d) placing said stencil adjacent an electrical substrate material and printing thereon a conductor, resistor, dielectric, solder mask or solder paste.

23. The method of claim 2, wherein the thin film liquid resist is a photoactive compound or blend of photoactive compounds.

24. The method of claim 3, wherein the dry film resist is a photoactive compound or blend of photoactive compounds.

25. The method of claim 5, wherein the thick film liquid resist is a photoactive compound or blend of photoactive compounds.

26. A method for fabricating an electrical substrate comprising:

(a) applying a pattern of thin film liquid resist, which is complementary to a pattern of a screen printing stencil for an electrical circuit, onto a conductive mandrel;

(b) electroforming a patterned metal layer onto portions of the mandrel determined by the pattern of resist such that the patterned metal layer overlaps the pattern of resist at resist spots to form a depressed orifice in the electroformed layer;

(c) removing the layer from the mandrel to provide a screen printing stencil; and (d) placing said stencil adjacent an electrical substrate and printing said electrical circuit thereon.

27. The method of claim 1, wherein the thick film pattern of resist is at least 0.1 mm thick.

28. The method of claim 1, wherein at least one section of the patterned metal layer has a thickness between about 0.1 mm and about 0.2 mm.

* * * * *